United States Patent [19]

Horikawa

[11] Patent Number: 4,787,088
[45] Date of Patent: Nov. 22, 1988

[54] SEMICONDUCTOR LASER BEAM SOURCE APPARATUS

[75] Inventor: Kazuo Horikawa, Kanagawa, Japan

[73] Assignee: Fuji Photo Film Co., Ltd., Kanagawa, Japan

[21] Appl. No.: 842,095

[22] Filed: Mar. 20, 1986

[30] Foreign Application Priority Data

Mar. 20, 1985 [JP] Japan .................................. 60-56942
Mar. 20, 1985 [JP] Japan .................................. 60-56943
Mar. 20, 1985 [JP] Japan .................................. 60-56944

[51] Int. Cl.$^4$ .......................... H01S 3/04; H01S 3/00
[52] U.S. Cl. .......................... 372/34; 372/36;
372/109; 372/103; 357/74; 350/582
[58] Field of Search ........... 372/109, 34, 36, 61,
372/65, 107, 108, 103; 357/72, 73, 74, 80, 81;
380/582, 584, 319

[56] References Cited

U.S. PATENT DOCUMENTS 3,877,780  4/1975  Taylor ................................ 350/584
3,989,360  12/1976 Duchet ............................... 350/319
4,037,079  7/1977  Armbruster ....................... 350/584
4,521,077  6/1985  Connelly ........................... 350/319

FOREIGN PATENT DOCUMENTS 0001119  1/1980  Japan ................................. 372/34

Primary Examiner—William L. Sikes
Assistant Examiner—Georgia Y. Epps
Attorney, Agent, or Firm—Sughrue, Mion, Zinn, Macpeak and Seas

[57] ABSTRACT

In a semiconductor laser beam source apparatus, a semiconductor laser is positioned inside of a case for shielding at least a laser beam outlet face from ambient atmosphere. The case is provided with a double-layer window which is positioned at least on the optical path of a laser beam emitted by the semiconductor laser, and which comprises two laser beam-permeable plates facing each other via a space shielded from the ambient atmosphere. Or, the case is provided with a heater for heating at least the laser beam passing section of the case surface, or with a blower for feeding dry air at least to the laser beam passing section.

6 Claims, 4 Drawing Sheets

SEMICONDUCTOR LASER BEAM SOURCE APPARATUS

BACKGROUND OF THE INVENTION

1. Field of the Invention

This invention relates to a semiconductor laser beam source apparatus provided with a semiconductor laser. This invention particularly relates to a semiconductor laser beam source apparatus provided with a semiconductor laser and a means for preventing moisture condensation from arising on an optical path of a laser beam emitted by a semiconductor laser.

2. Description of the Prior Art

Light beam scanning apparatuses wherein a light beam is deflected and scanned by a light deflector have heretofore been widely used, for example, in scanning recording apparatuses and scanning read-out apparatuses. As one of the means for generating a light beam in the light beam scanning apparatuses, a semiconductor laser is used. The semiconductor laser has various advantages over a gas laser or the like in that the semiconductor laser is small, cheap and consumes little power, and that the laser beam can be modulated directly by changing the drive current.

From the viewpoint of service life, efficiency, laser beam emission intensity, and the like, the semiconductor laser should preferably be operated at as low temperatures as possible. Therefore, for example, a cooling element is mounted on a mount for supporting the semiconductor laser, and the semiconductor laser is cooled during operation. However, when the semiconductor laser is cooled and the temperature of the semiconductor laser becomes lower than the ambient temperature, moisture condenses on the surface of the semiconductor laser. Moisture condensation adversely affects the operation of the semiconductor laser by, for example deteriorating the electric insulation. Further, when moisture condenses on a laser beam outlet face, the formed droplets act as a lens and adversely affect the convergence and directivity of the laser beam.

SUMMARY OF THE INVENTION

The primary object of the present invention is to provide a semiconductor laser beam source apparatus wherein no moisture condensation arises on the semiconductor laser and the optical path of the laser beam even though the temperature of the semiconductor laser is controlled to be lower than the ambient temperature during operation of the semiconductor laser.

Another object of the present invention is to provide a semiconductor laser beam source apparatus which emits a laser beam at a high accuracy.

The present invention provides a semiconductor laser beam source apparatus provided with a semiconductor laser for emitting a laser beam, wherein said semiconductor laser is positioned inside of a case for shielding at least a laser beam outlet face from the ambient atmosphere, and said case is provided with a double-layer window positioned at least on the optical path of said laser beam, said double-layer window comprising two laser beam-permeable plates facing each other with a space, which is shielded from the ambient atmosphere, intervening therebetween.

In the semiconductor laser beam source apparatus of the present invention, the case shields the laser beam outlet face from ambient air, thereby preventing moisture condensation from arising on the laser beam outlet face. The double-layer window comprising two laser beam-permeable plates facing each other with a space, which is shielded from the ambient atmosphere, intervening therebetween allows passage of the laser beam and prevents moisture condensation from arising on the optical path of the laser beam.

Since the laser beam outlet face is shielded from the ambient atmosphere, no moisture condensation arises on the laser beam outlet face even though the temperature of the semiconductor laser is controlled to be lower than the ambient temperature. Further, since the double-layer window having the space is positioned on the laser beam optical path of the case, the space exhibits a heat insulation effect and prevents moisture condensation from arising on the laser beam optical path even though the temperature inside of the case decreases to below the ambient temperature outside of the case as the temperature of the semiconductor laser decreases. Accordingly, the semiconductor laser beam source apparatus of the present invention is free from problems such as deterioration in electric insulation, and achieves laser beam emission at a high accuracy, for example, at high directivity and convergence.

The present invention also provides a semiconductor laser beam source apparatus provided with a semiconductor laser for emitting a laser beam, wherein said semiconductor laser is positioned inside of a case for shielding at least a laser beam outlet face from the ambient atmosphere, and said case is provided with a heater for heating at least a case surface portion through which said laser beam passes.

In the second mentioned semiconductor laser beam source apparatus of the present invention, the case acts as described above and the heater prevents moisture condensation from arising on the laser beam optical path of the case.

The present invention further provides a semiconductor laser beam source apparatus provided with a semiconductor laser for emitting a laser beam, wherein said semiconductor laser is positioned inside of a case for shielding at least a laser beam outlet face from the ambient atmosphere, and said case is provided with a blower for feeding dry air at least to a case surface portion through which said laser beam passes.

In the last mentioned semiconductor laser beam source apparatus of the present invention, the case acts as described above and the blower prevents moisture from being condensed on the laser beam optical path of the case by evaporating moisture on the case surface.

DESCRIPTION OF THE PREFERRED EMBODIMENTS

The present invention will hereinbelow be described in further detail with reference to the accompanying drawings.

Figure 1:
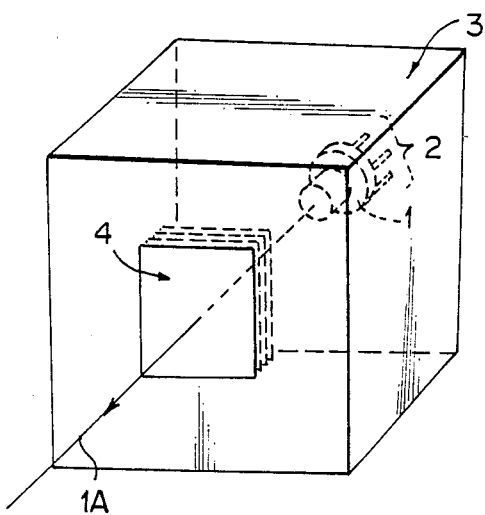
FIG. 1 is a perspective view schematically showing an embodiment of the semiconductor laser beam source apparatus in accordance with the present invention.
Figure 2:
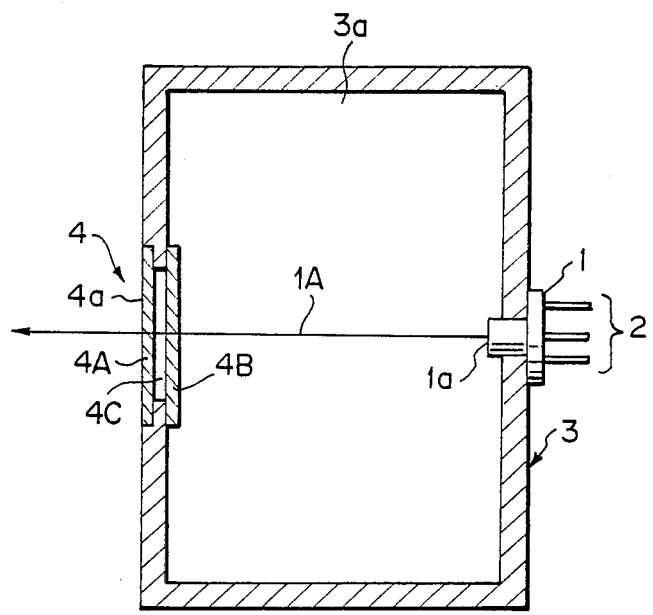
FIG. 2 is a sectional view showing the embodiment of FIG. 1.

Referring to FIGS. 1 and 2, a semiconductor laser 1 is activated by power fed via lead wires 2, and mounted on one side face of a case 3 with a laser beam outlet face 1a exposed inside of the case 3. The case 3 is fabricated to shield the inside thereof from the ambient atmosphere. The temperature of the semiconductor laser 1 is controlled to a comparatively low value suitable for operation by a temperature control device (not shown) mounted near the semiconductor laser 1, and emits a laser beam 1A from the laser beam outlet face 1a.

A double-layer window 4 is positioned on the optical path of the laser beam 1A on the case 3. As shown in FIG. 2, the double-layer window 4 comprises laser beam-permeable plates 4A and 4B facing each other via a space 4C shielded from the ambient atmosphere. The laser beam 1A passes through the double-layer window 4 to the outside of the case 3. The laser beam permeable plates 4A and 4B may be made of a material permeable to laser beams, such as glass. The space 4C may contain air or may be evacuated.

Figure 3:
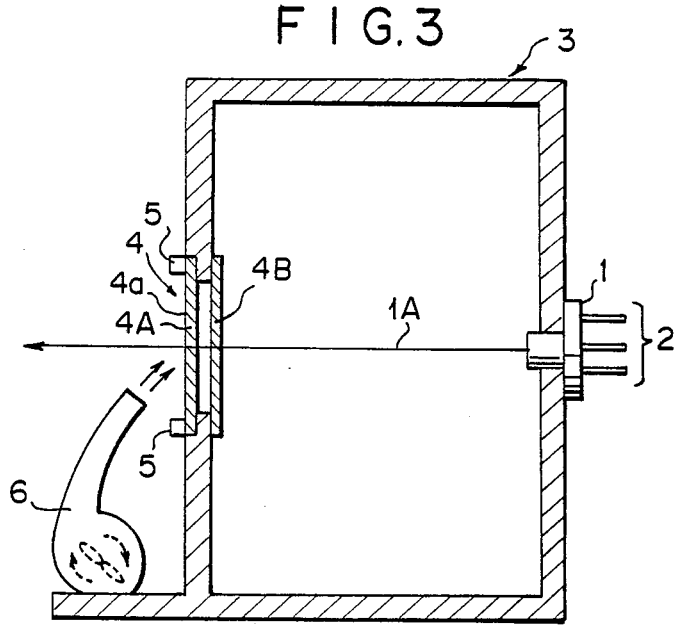
FIG. 3 is a sectional view showing another embodiment of the semiconductor laser beam source apparatus in accordance with the present invention.

When the temperature of the semiconductor laser 1 is controlled and becomes lower than the ambient temperature, air 3a inside of the case 3 is cooled together with the semiconductor laser 1, and the inner laser beam-permeable plate 4B is cooled by the cooled air 3a. At this time, since the laser beam outlet face 1a of the semiconductor laser 1 is shielded from the ambient atmosphere, no moisture condensation is caused on the laser beam outlet face 1a by a decrease in temperature of the semiconductor laser 1. On the other hand, since the outer laser beam-permeable plate 4A is in contact with the ambient atmosphere, the temperature of the outer laser beam-permeable plate 4A is near the ambient temperature and higher than the temperature of the inner laser beam-permeable plate 4B. Therefore, if the outer laser beam-permeable plate 4A is cooled by the inner laser beam-permeable plate 4B, which is at a comparatively low temperature, moisture condensation will arise on the outer surface of the laser beam-permeable plate 4A. However, in this embodiment, the space 4C present between the laser beam-permeable plates 4A and 4B exhibits a heat insulation effect, and the plates 4A and 4B are not thermally affected by each other. Therefore, no moisture condensation arises on the laser beam-permeable plates 4A and 4B positioned on the optical path of the laser beam 1A, and convergence, directivity, or the like of the laser beam 1A is not adversely affected by moisture condensation. When the temperature difference between the semiconductor laser 1 and the ambient atmosphere is large, the space 4C in the double-layer window 4 may be adjusted in degree of a evacuation, and the thickness (i.e. the distance between the laser beam-permeable plates 4A and 4B) and the volume of the space 4C may be increased. Also, in order to obtain the effect of the double-layer window 4, the case 3 should preferably be fabricated of a heat insulating material. The double-layer window 4 is positioned at a section at least including the laser beam optical path of the case 3, and the size and the shape thereof may be selected in accordance with various conditions of the apparatus, such as the environmental conditions. It is also possible to fabricate the whole case 3 in the double-layer configuration. As shown in FIG. 3, in order to improve the moisture condensation preventing effect, it is also possible to position heaters 5, 5 on the outer surface of the double-layer window 4, and to activate the heaters 5, 5 when necessary to heat the laser beam-permeable plate 4A to a temperature above the ambient temperature. In this embodiment, a blower 6 is further positioned outside of the case 3 to feed dry air at least to the section of the outer surface 4a of the laser beam-permeable plate 4A through which the laser beam 1A passes, thereby evaporating any moisture on the optical path of the laser beam 1A by dry air.

Figure 4:
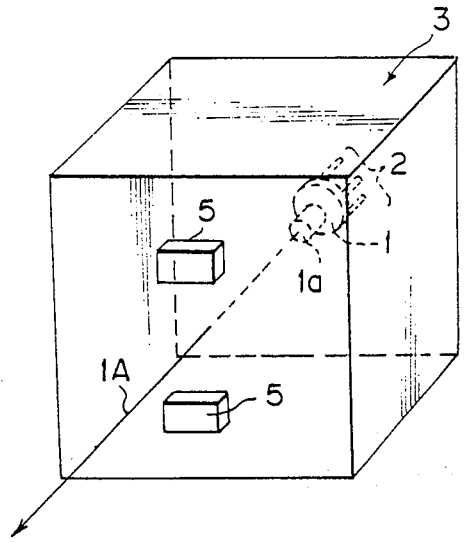
FIG. 4 is a perspective view schematically showing a further embodiment of the semiconductor laser beam source apparatus in accordance with the present invention.
Figure 5:
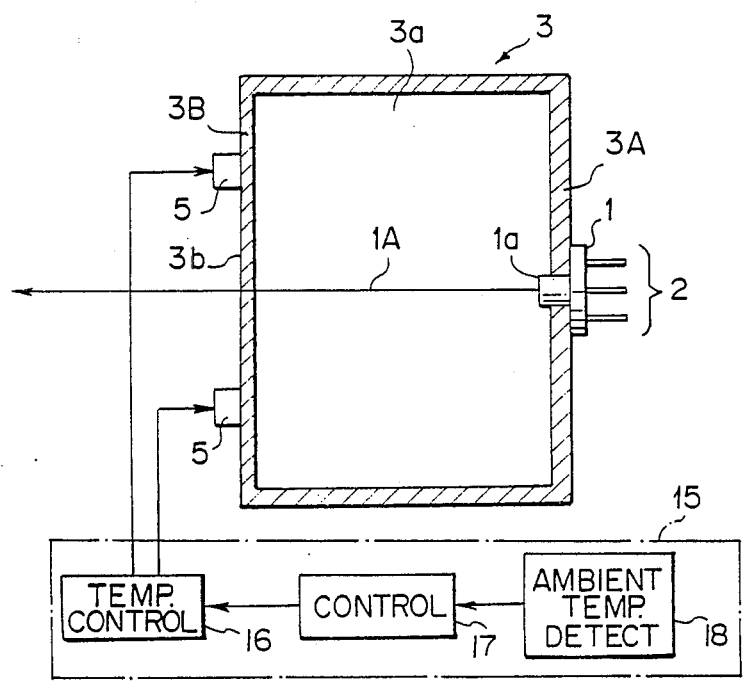
FIG. 5 is a sectional view showing the embodiment of FIG. 4.

FIGS. 4 and 5 show a further embodiment of the semiconductor laser beam source apparatus in accordance with the present invention, in which the semiconductor laser 1 is mounted on a side wall 3A of a case 3 fabricated of a material permeable to the laser beam 1A, such as glass. The laser beam 1A emitted by the semiconductor laser 1 passes through a side wall 3B facing the side wall 3A via the inside of the case 3, and is emitted outwardly of the case 3.

In this embodiment, a pair of heaters 5, 5 are positioned on an outer wall surface 3b of the side wall 3B in the vicinity of the section through which the laser beam 1A passes, and heat said section. When the heaters 5, 5 are activated, the laser beam passing section of the side wall 3B at which the temperature becomes lower than the ambient temperature as the semiconductor laser 1 is activated is heated, and moisture condensation at said section is prevented. Heating by the heaters 5, 5 may be conducted so that the laser beam passing section of the side wall 3B is maintained at a temperature generating no moisture condensation. However, in order to ensure prevention of moisture condensation, the laser beam passing section of the side wall 3B should preferably be heated to a temperature slightly higher than the ambient temperature. Also, in the case where the environmental conditions of the apparatus are almost constant and fluctuations in ambient temperature are small, the heaters 5, 5 may be operated under constant conditions to maintain constant the temperature of the laser beam passing section of the side wall 3B. However, in the case where the ambient temperature is expected to change due to changes in operating environment or the temperature should be accurately controlled, a heater control circuit 15 as indicated by the chain line in FIG. 5 may be installed to control the heater operation.

The heater control circuit 15 comprises a temperature controller 16, a controller 17 for controlling the temperature controller 16, and an ambient temperature detector 18 for detecting the ambient temperature and feeding the detection signal to the controller 17. When the ambient temperature is detected by the ambient temperature detector 18 and the detection signal is sent to the controller 17, the controller 17 generates a control signal based on the detection signal and sends it to the temperature controller 16. Based on the control signal, the temperature controller 16 operates the heaters 5, 5 at appropriate power. Therefore, as the ambient temperature fluctuates, the heating power of the heaters 5, 5 is changed to heat the laser beam passing section of the side wall 3B at appropriate power. It is also possible to use heaters capable of heating the case 3 to high temperatures as the heaters 5, 5, to position a temperature detector in the vicinity of the laser beam passing section on the outer wall surface 3b, and to turn on and off the heaters 5, 5 based on the signal sent from the temperature detector.

The number, sizes, shapes and the like of the heaters 5, 5 are not limited to those in the embodiment of FIG. 4. For example, a ring-shaped heater surrounding the laser beam passing section may be positioned on the outer wall surface 3b. Further, the heater or heaters may be positioned on the inner wall surface of the side wall 3B. Also the heater or heaters may be positioned in the vicinity of the case 3 without being secured thereto, thereby heating the laser beam passing section on the case surface from outside of the case.

Figure 6:
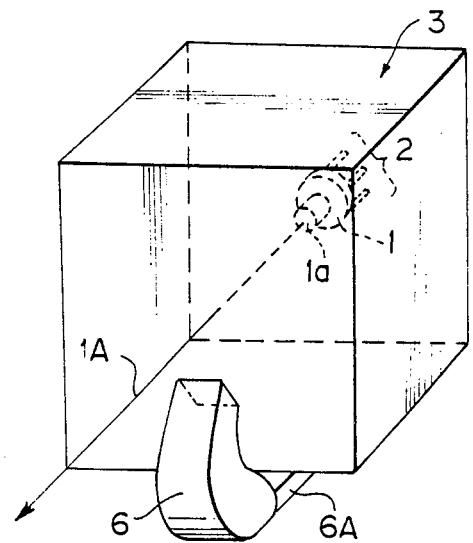
FIG. 6 is a perspective view schematically showing a still further embodiment of the semiconductor laser beam source apparatus in accordance with the present invention.
Figure 7:
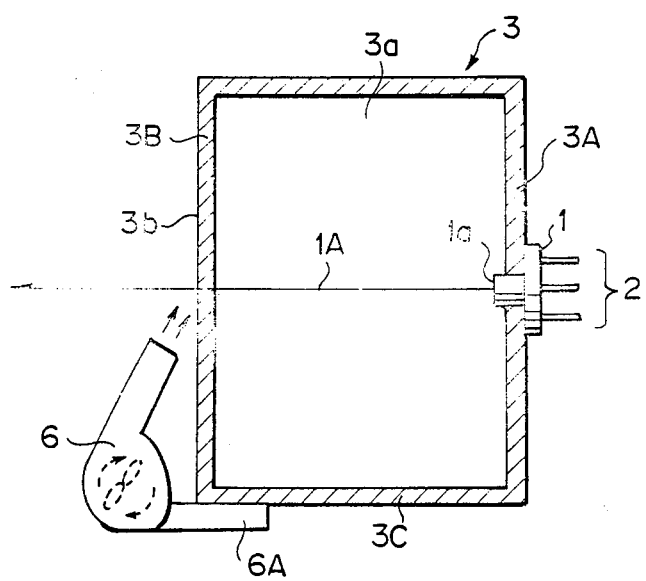
FIG. 7 is a sectional view showing the embodiment of FIG. 6.

FIGS. 6 and 7 show a still further embodiment of the semiconductor laser beam source apparatus in accordance with the present invention, which is similar to the embodiment of FIG. 4 except that, instead of the heaters 5, 5, a blower 6 is used. The blower 6 is supported by a supporting base 6A mounted on a lower end wall 3C of the case 3. The blower 6 sends dry air to the laser beam passing section on the outer wall surface 3b of the side wall 3B. Simultaneously with activation of the semiconductor laser 1, the blower 6 is activated to send dry air to the laser beam passing section on the case surface which is cooled as the semiconductor laser 1 is cooled. The dry air evaporates moisture at the laser beam passing section on the outer wall surface 3b, thereby preventing moisture condensation. The power of the dry air sent by the blower 6 should be selected in accordance with various conditions such as the ambient temperature, ambient humidity and the temperature of the semiconductor laser 1 so that no moisture condensation arises at least at the laser beam passing section of the outer wall surface 3b. Further, the temperature of the dry air should preferably be higher than the ambient temperature. When the temperature of the dry air is high, moisture evaporation is promoted, and the section to which the dry air is blown is heated so that the case itself is adjusted to a condition free from moisture condensation.

In the case where the environmental conditions of the apparatus are almost constant and fluctuations in ambient temperature and humidity are small, dry air of constant power may be continuously generated by the blower 6. However, when the environmental conditions such as the ambient temperature and humidity are expected to fluctuate largely or the power for driving the blower 6 should be minimized by avoiding unnecessary blowing, it is possible to use a blower control circuit for adjusting the power of the dry air generated by the blower 6, or the like, and turning on and off the blower 6. Such blower drive control using the blower control circuit will be described below with reference to FIG. 8.

Moisture condensation on the surface of the case 3 is related to the ambient temperature, ambient humidity and the temperature of the case surface. Therefore, in the embodiment of FIG. 8, a blower control circuit 25 is provided with a temperature detector 26 for detecting the ambient temperature, and a humidity detector 27 for detecting the ambient humidity. Detection signals 26a, 27a generated by the detectors 26 and 27 are sent to a controller 28. On the other hand, a temperature detector 29 is positioned in the vicinity of the laser beam passing section on the outer wall surface 3b, and a detection signal 29a generated by the temperature detector 29 is sent to the controller 28. Based on the detection signals 26a, 27a and 29a, the controller 28 generates, by way of example, one of three predetermined control signals 28a by use of a preset memory, and sends it to a drive controller 30 for driving the blower 6. Based on which of the three signals 28a is sent by the controller 28, the drive controller 30 adjusts the blower 6 to an operation mode selected, for example, from among strong air feed, weak air feed and feed stop. Therefore, it becomes possible to adjust the operation of the blower 6 in accordance with fluctuations in environmental conditions such as the ambient temperature and humidity and to operate the blower 6 efficiently.

Figure 8:
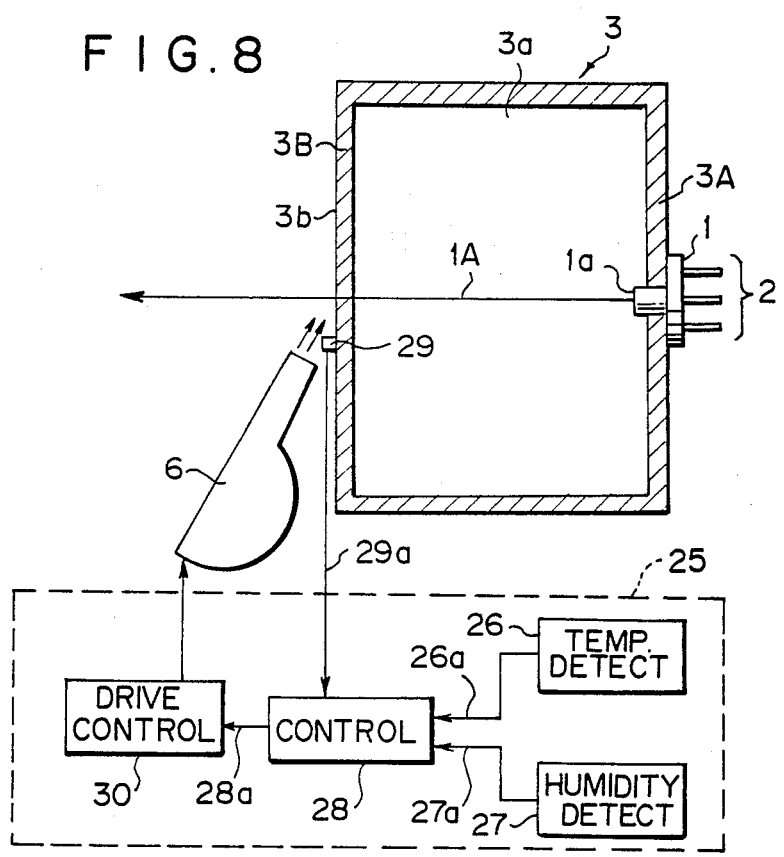
FIG. 8 is a sectional view showing another embodiment of the semiconductor laser beam source apparatus in accordance with the present invention.

The shape of the blower 6 is not limited to those shown in FIGS. 6 and 8, and the position thereof may be selected freely insofar as the dry air is blown to the laser beam passing section on the outer wall surface 3b. Further, it is possible to use a plurality of blowers to feed dry air in many directions. In this case, the air flow rate may be adjusted by changing the number of the activated blowers.

In the aforesaid embodiments, the case 3 is provided with a single semiconductor laser 1. However, a plurality of semiconductor lasers may be positioned in the same case 3. In this case, a double-layer window of type used in the embodiments of FIGS. 1 and 3 may be positioned on each of the optical paths of the laser beams emitted by the semiconductor lasers. In the embodiments of FIGS. 4, 6 and 8, the case surface sections through which the laser beams emitted by the semiconductor lasers pass may be heated with the heaters or dried with the blowers. Further, the semiconductor laser may be positioned in various manners insofar as the laser beam outlet face is shielded from the ambient atmosphere. For example, the whole semiconductor laser may be positioned inside of the case 3.

I claim:

1. A semiconductor laser beam source apparatus provided with a semiconductor laser for emitting a laser beam, wherein said semiconductor laser is positioned inside of a case for shielding at least a laser beam outlet face from the ambient atmosphere, and said case is provided with a double-layer window positioned at least on the optical path of said laser beam, said double-layer window comprising two laser beam-permeable plates facing each other with a space, which is shielded from the ambient atmosphere, intervening therebetween.

2. An apparatus as defined in claim 1 wherein said space intervening between said two laser beam-permeable plates is evacuated.

3. An apparatus as defined in claim 1 wherein said case is fabricated of a heat insulating material.

4. An apparatus as defined in claim 1 further comprising heaters positioned on the outer surface of said double-layer window, and a blower positioned outside of said case for feeding dry air at least to a laser beam passing section of the outer surface of said double-layer window.

5. A semiconductor laser beam source apparatus provided with a semiconductor laser for emitting a laser beam, wherein said semiconductor laser is positioned inside of a case for shielding at least a laser beam outlet face from the ambient atmosphere, and said case is provided with a blower for feeding dry air at least to a case surface portion through which said laser beam passes, and a blower control circuit for controlling the operation of said blower, said blower control circuit comprising, a control circuit, an ambient temperature detector having an output coupled to said control circuit, an ambient humidity detector having an output coupled to said control circuit, a case surface temperature detector having an output coupled to said control circuit, and a drive controller for controlling the operation of said blower in response to a control signal generated by said control circuit, said control circuit generating said control signal in response to detection signals sent from said ambient temperature detector, said ambient humidity detector and said case surface temperature detector.

6. A semiconductor laser beam source apparatus provided with a semiconductor laser for emitting a laser beam, comprising:

a case for enclosing said semiconductor laser for shielding at least a laser beam outlet face from the ambient atmosphere, said case being provided with a heater for heating at least a case surface portion through which said laser beam passes, said heater being located adjacent said case surface portion; and heater control circuit means for controlling the operation of said heater, said heater control circuit means comprising a temperature controller connected to said heater means, a controller connected to said temperature controller for controlling said temperature controller, and an ambient temperature detector connected to said controller for detecting the ambient temperature and feeding a detection signal to said controller.

* * * * *